(12) United States Patent
Schmid et al.

(10) Patent No.: US 6,787,832 B2
(45) Date of Patent: Sep. 7, 2004

(54) SEMICONDUCTOR MEMORY CELL AND SEMICONDUCTOR MEMORY DEVICE

(75) Inventors: Günter Schmid, Hemhofen (DE); Marcus Halik, Erlangen (DE); Hagen Klauk, Erlangen (DE); Christine Dehm, Nürnberg (DE); Thomas Haneder, Dachau (DE); Thomas Mikolajick, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/395,457

(22) Filed: Mar. 24, 2003

(65) Prior Publication Data

US 2003/0178660 A1 Sep. 25, 2003

(30) Foreign Application Priority Data

Mar. 22, 2002 (DE) .......................................... 102 12 962

(51) Int. Cl.[7] .......................... H01L 29/76; H01L 29/94; H01L 31/062; H01L 31/113; H01L 31/119
(52) U.S. Cl. ....................... 257/295; 257/296; 257/300; 438/3
(58) Field of Search ................................. 257/295, 296, 257/300; 438/3, 275, 279, 240–242

(56) References Cited

U.S. PATENT DOCUMENTS

| 5,474,947 A | * | 12/1995 | Chang et al. | ................ 438/257 |
| 5,580,814 A | * | 12/1996 | Larson | ............................ 438/3 |
| 5,731,608 A | * | 3/1998 | Hsu et al. | .................... 257/295 |
| 6,194,752 B1 | * | 2/2001 | Ogasahara et al. | ......... 257/295 |
| 6,566,148 B2 | * | 5/2003 | Hsu et al. | ....................... 438/3 |

* cited by examiner

*Primary Examiner*—Mary Wilczewski
*Assistant Examiner*—Monica Lewis
(74) *Attorney, Agent, or Firm*—Laurence A. Greenberg; Werner H. Stemer

(57) ABSTRACT

A semiconductor memory cell has a field-effect transistor device and a ferroelectric storage capacitor. The field-effect transistor device has a channel region that includes or is made of an organic semiconductor material. Besides a first gate electrode of the gate electrode configuration of the field-effect transistor device, an additional selection gate electrode is provided, by way of which the field-effect transistor device can be switched off without influencing the storage dielectric and independently of the first gate electrode.

36 Claims, 9 Drawing Sheets

SEMICONDUCTOR MEMORY CELL AND SEMICONDUCTOR MEMORY DEVICE

BACKGROUND OF THE INVENTION

Field of the Invention

The invention lies in the semiconductor technology field. More specifically, the invention relates to a semiconductor memory cell and to a semiconductor memory device formed therefrom.

In semiconductor memory devices, a multiplicity of semiconductor memory cells are combined in a memory area. An objective of the further development of modern semiconductor memory technologies is, inter alia, to improve the operational reliability and to increase the integration density of the memory cells in the memory devices.

An alternative way of realizing very favorable semiconductor memory cells and semiconductor memory devices that can be processed in a simple manner consists in departing from silicon technology, which is complicated and capital-intensive, and employing very much simpler fabrication methods, for example by printing on the structures. The economic compulsion toward extreme miniaturization of the components is obviated in this case. Attention is in this case paid in particular to improving nonvolatile memory mechanisms and to the integration thereof.

It is problematic in the case of prior art nonvolatile memory mechanisms that the access to each individual memory cell is effected via corresponding electrical signals; these can also have the effect that the memory contents are in the process changed inadvertently by the corresponding electrical access signals.

SUMMARY OF THE INVENTION

It is accordingly an object of the invention to provide a semiconductor memory cell and a semiconductor memory device, which overcomes the above-mentioned disadvantages of the heretofore-known devices and methods of this general type and which provides for a semiconductor memory cell in which information can be stored in nonvolatile form, and in which the memory cell can be accessed without any change to the information or loss of information.

With the foregoing and other objects in view there is provided, in accordance with the invention, a semiconductor memory cell, comprising:

a field-effect transistor device forming an access device, the field-effect transistor device having first and second source/drain regions, a channel region, comprising or consisting of an organic semiconductor material, between the first and second source/drain regions, and a gate electrode configuration; and
a storage capacitor having a ferroelectric storage dielectric and at least one electrode forming a first gate electrode of the gate electrode configuration of the field-effect transistor device.

In other words, the objects of the invention are achieved with a semiconductor memory cell that has a field-effect transistor device as access device, which has a channel region with or made of an organic semiconductor material between a first and a second source/drain region. Furthermore, a storage capacitor is provided, which has a ferroelectric storage dielectric and at least one electrode, which functions as a first gate electrode of a gate electrode configuration of the field-effect transistor device.

A first central concept of the present invention is the provision of an organic semiconductor material in the channel region of the field-effect transistor device. Organic semiconductor materials are particularly suitable for particular applications in which large scale integration is not required and for which a mechanically flexible substrate is of value, for example in ID tags, smart cards, or the like. The outstanding properties are essentially based on the possibility of a mechanically flexible substrate material and also on the relatively low costs of such materials and the low costs of the methods used for processing these materials.

In accordance with a preferred embodiment of the invention, furthermore, a selection gate electrode of the gate electrode configuration is provided, by means of which the field-effect transistor device can be switched off and/or, if appropriate, switched on in a defined and controllable manner, to be precise substantially without influencing the storage dielectric and/or substantially independently of the first gate electrode.

A further central idea of the present invention thus consists in forming a selection gate electrode in a form which is independent of the first gate electrode, by means of which the field-effect transistor device can be switched off and/or, if appropriate, switched on in a defined and controllable manner, without influencing the storage dielectric. What is thereby achieved is that an access to the field-effect transistor device can be interrupted in a defined manner, so that a signal current that has been detected, if appropriate, in the case of an arrangement of a plurality of memory cells according to the invention, can originate exclusively from selected semiconductor memory cells, because the respective nonselected memory cells make no contribution to the measurement current and thus to the signal current. Upon the application of a corresponding electrical potential difference and with respect to the channel zone or channel region, the selection gate electrode for switching off the field-effect transistor device in a defined manner exerts essentially no electromagnetic influence on the storage dielectric, so that the electromagnetic material properties of the storage dielectric, for example the state of polarization, are not influenced thereby. The information state corresponding to the electromagnetic material state of the storage dielectric thus remains untouched and is preserved, so that the information is not lost or changed even in the event of random access as a result of the switching-on or switching-off of the field-effect transistor device.

In accordance with a further embodiment of the semiconductor memory cell according to the invention, it is provided that, in this case, different information states can be represented and/or detected as different electric currents flowing for a given electrical potential difference between the source/drain regions via the respective channel region.

In this case, it is furthermore provided that the current via the channel region can be influenced by means of states of polarization of the ferroelectric storage dielectric which correspond to different information states. Consequently, by means of the interlinking of the state of polarization corresponding to the information—of the ferroelectric storage dielectric with the electromagnetic influencing by the state of polarization on the channel region, the detection or signal current that is to be measured, if appropriate, is influenced, as a result of which the information stored as a state of polarization in the storage capacitor actually becomes able to be read out toward the outside.

In accordance with another embodiment of the semiconductor memory cell according to the invention, it is provided that the gate electrode configuration is electrically insulated from the source/drain regions and the channel region by at least one insulation region. This is one of the basic preconditions for the functioning of the semiconductor memory cell formed in an integrated manner with a field-effect transistor device and a storage capacitor.

In a particularly preferred embodiment of the semiconductor memory cell according to the invention, the ferroelectric storage dielectric or a part thereof is provided as or in a region between the channel region and the first gate electrode of the gate electrode configuration. This can be done in particular by the ferroelectric storage dielectric or a part thereof being formed either altogether as the insulation region or as part thereof.

In another embodiment, the ferroelectric storage dielectric is formed in direct proximity or in contact with the channel region, at least one or both source/drain regions, the first gate electrode and/or the selection gate electrode. This results in a particularly compact and space-saving design of the semiconductor memory cell according to the invention, and the contact between the individual materials is noncritical as long as the respective insulation conditions are complied with and no chemical or electrochemical conversion processes which modify the morphological structure and thus the functioning of the semiconductor memory cell according to the invention occur at the contact areas or interfaces.

In another embodiment of the semiconductor memory cell according to the invention, it is provided that, with regard to a first direction given by the arrangement of the source/drain regions and of the channel region, the first gate electrode and the selection gate electrode are at a very small lateral distance from one another. This means, for example, that the first gate electrode and the selection gate electrode lie very close together without touching and/or without being in contact with one another, so that these two electrodes are spatially closely adjacent to one another in order to ensure a compact design, and, at the same time, remain able to be electrically driven independently of one another.

Furthermore, it may be provided that, with regard to the first direction defined above, the first gate electrode and the selection gate electrode are arranged vertically offset with respect to one another.

In this case, it is provided, in particular, that the selection gate electrode is disposed on a side of the insulation region which faces the channel region and/or the source/drain regions, in particular in electrically insulated form.

In another embodiment of the semiconductor memory cell according to the invention, a second gate electrode of the gate electrode configuration is provided. The second gate electrode functions, in particular, as a second capacitor electrode and/or as an electrode which influences the ferroelectric storage dielectric.

Preferably, the second gate electrode may be formed as a free electrode or as a floating gate. However, it is also conceivable for the second gate electrode of the gate electrode configuration to be contact-connected separately and to have an individual electrical potential applied to it in order to influence the ferroelectric storage dielectric correspondingly.

It is particularly advantageous in this case if the ferroelectric storage dielectric or a part thereof is formed directly between the first and second gate electrodes. As a result, the electromagnetic state, for example the state of polarization, of the storage dielectric can be influenced in a particularly direct and simple manner.

In this case, it is furthermore provided that the second gate electrode is formed on a side of the channel region and/or of the source/drain regions which is remote from the first gate electrode. In accordance with this arrangement, the first gate electrode and the second gate electrode are opposite one another with regard to the insulation region, the channel region and/or the source/drain regions, the latter being arranged between the first gate electrode and the second gate electrode.

In principle, all material combinations are conceivable with regard to the material of the channel region and also with regard to the storage dielectric, as long as the material of the channel region is only an organic semiconductor or the like and as long as the material of the storage dielectric essentially has ferroelectric properties for realizing the memory mechanism.

In accordance with again a further feature of the invention, the ferroelectric storage dielectric has or is formed from an inorganic material, for example strontium bismuth tantalate SBT, lead zirconium titanate PZT and/or the like. Organic materials are also conceivable, for example a polymeric ferroelectric based on polyvinylidene difluoride PVDF, polytrifluoroethylene PTrFE and/or the like. Mixtures, compounds or derivatives of these substances or the copolymers or terpolymers thereof are also conceivable.

With regard to the organic semiconductor material for the channel region, it is provided that p-type semiconductors based on condensed aromatic compounds are used, there, use being made of, in particular, anthracenes, tetracenes, pentacenes and/or the like, polythiophenes, for example poly-3-alkylthiophenes, polyvinylthiophenes and/or the like, polypyrroles, organometallic complexes of phthalocyanines, porphyrins, in particular of copper and/or the like.

Furthermore, it is advantageous that an, in particular, flexible, substrate is provided, in particular using metals, for example copper, nickel, gold, iron sheet and/or the like, plastics, for example polystyrene, polyethylene, polyester, polyurethane, polycarbonate, polyacrylate, polyimide, polyether, polybenzoxazole and/or the like, paper and/or the like.

With the above and other objects in view there is also provided, in accordance with the invention, a semiconductor memory device formed with a plurality or multiplicity of the above-summarized memory cells.

In this case, various contact connections of the respective source/drain regions and/or gate regions may be provided.

In accordance with a particularly advantageous development of the semiconductor memory device according to the invention, it is provided that a connection of the source/drain regions and/or of the gate regions of a given semiconductor memory cell to other semiconductor memory cells of the semiconductor memory device, preferably in a matrix arrangement, is effected by direct connection of the respective conductive regions.

As an alternative or in addition, it may be provided that the connection of a given semiconductor memory cell of the semiconductor memory device with regard to the source/drain regions and/or the gate regions to other cells of the semiconductor memory device is realized by means of an additional metal track or metallization and optionally provided corresponding contacts.

The dielectric region may be formed either from an organic material or from an inorganic material or from materials of this type.

Appropriate inorganic materials are chalcogenides, silicon dioxide, silicon nitride, aluminum oxide, zinc oxide, hafnium oxide and/or the like and/or mixtures and/or compounds thereof.

In the case of the organic materials, monolayers or films of finite thickness are also appropriate, by way of example. Examples of preferred materials here are polymers, polystyrene, polyethylene, polyester, polyurethane, polycarbonate, polyacrylate, polyimide, polyether, polybenzoxazoles and/or the like and/or mixtures or compounds thereof.

For optionally provided insulation regions, too, various, in particular the same, materials or material combinations are provided, for example inorganic compounds, in particular made of silicon dioxide, silicon nitride, aluminum oxide, zinc oxide, hafnium oxide and/or the like and/or mixtures and/or compounds thereof.

Organic compounds are also conceivable, in particular polymers, polystyrene, polyethylene, polyester, polyurethane, polycarbonate, polyacrylate, polyimide, polyether, polybenzoxazoles and/or the like and/or mixtures or compounds thereof.

Electronics based on organic or organometallic compounds is discussed for applications, e.g. ID tags, smart cards, etc., which are subject to considerably lower performance requirements in comparison with chips fabricated from silicon. The price permitted for these systems can no longer be achieved by silicon-based electronics.

In the material development of volatile and nonvolatile memories based on organic polymers and molecules (also organometallic), e.g. materials based on PVDF (polyvinylidene difluoride) are suitable as memory materials. In particular, the copolymer with trifluoroethylene PVDF-PTrFE; 70:30 exhibits the properties sufficient for a memory application of medium to low density.

The ferroelectricity of this material class can be utilized for memory applications.

This invention describes, inter alia, a component which can be integrated in circuits with organic semiconductors and which couples a ferroelectric capacitor directly to a field-effect transistor. In the case of a component of this type, the problem arises that, on account of the ferroelectric hysteresis, the gate voltage can only be varied in a very limited range without varying the content of the memory cells.

However, the procedure according to the invention affords the following advantages, in particular:

The ferroelectricity of PVDF-based polymers is utilized according to the invention in order to construct a polymer-based rewritable, nonvolatile memory element. The known inorganic ferroelectrics PZT or SBT can also be used as an alternative.

This component contains, according to the invention, a first built-in transistor function to which the ferroelectric material is directly coupled, and a second built-in transistor function which is arranged in series therewith and permits the channel to be switched off independently of the state of the ferroelectric.

The gate electrode and a capacitor electrode of the memory element are fabricated in one step.

The operating point of the ferrocapacitor can be adapted to the polymer-based transistors by varying the layer thickness (1–50 V, preferably 5–15 V).

The size of the ferrocapacitor is noncritical since inexpensive substrate material (polymer films, paper) is worked with and the price is not determined by the chip size.

The signal swing for read/write can be controlled by way of the size of the ferrocapacitor, i.e. scaling problems do not occur (1–100 $\mu m^2$)

The nondestructive read-out is effected via the state of the integrated transistor (ON-OFF).

Writing is effected by means of the capacitor/gate electrodes.

One inventive aspect resides in the construction of a polymer-based component which contains a ferroelectric capacitor with an integrated transistor and an additional control electrode.

In an exemplary basic version of the component proposed, a ferrocapacitor is prescribed, comprising two electrodes and the ferroelectric dielectric. One electrode simultaneously forms the gate electrode of the field-effect transistor constructed above that. The further components of the transistor are formed by the gate dielectric, the source electrode and the drain electrode. The channel of the memory transistor is formed in an organic semiconductor in the region near the interface with the gate dielectric in the region lying above the capacitor electrode. An additional selection electrode allows the formation of a second channel region at the surface of the semiconductor.

In order to explain the functioning, it is assumed that the organic semiconductor is formed from the p-type channel material pentacene. The ferrocapacitor is polarized such that the negative polarization charge is situated at the second electrode, while the positive polarization charge is situated at the first electrode. After a corresponding potential gradient has been applied to the source and drain electrodes, current flows since the transistor is in the on state. This switching state can be repeatedly read out as long as the polarization is not changed. The current flow can then be modulated on the one hand by the state of the ferroelectric (memory effect) and on the other hand by the additional selection electrode. With the selection electrode, it can thus be ensured according to the invention that, in a matrix arrangement, the cells which are not intended to be read do not contribute to the current flow.

In one variant of the memory cell, the ferroelectric is utilized directly as gate dielectric of the memory transistor.

This results in a better coupling of the polarization charge into the channel of the memory transistor. However, this variant has the disadvantage that, on account of the lack of a second capacitor electrode, channel and contact region of the transistor have to be used as counterelectrode during writing. Since this can lead to problems—depending on the precise dimensioning of the component—during writing, an arrangement with an additional electrode and additional gate dielectric at the rear side of the transistor is proposed. The additional electrode can be utilized as counterelectrode during writing. In contrast to the arrangement described above, higher write voltages are required, since the active transistor region rep resents a series capacitance across which a part of the applied voltage is dropped.

Finally, the ferroelectric can also be used as gate dielectric of the selection transistor. This arrangement is distinguished by a particularly simple process implementation. With the use of inorganic ferroelectrics, such as, e.g. PZT or SBT, the advantage of a very high gate capacitance is furthermore afforded on account of the very high dielectric constant (a few 100) of these materials. As a result, the selection element can be switched with comparatively low voltages.

The following materials are conceivable:

The substrate materials used are highly diverse. Examples that may be mentioned here are flexible films made of metal (copper, nickel, gold, iron sheet, etc.), plastics (polystyrene, polyethylene, polyester, polyurethanes, polycarbonates, polyacrylates, polyimides, polyether, polybenzoxazoles, etc.) or paper. Suitable organic semiconductors are the p-type semiconductors based on condensed aromatic compounds (anthracene, tetracene, pentacene), polythiophene (poly-3-alkylthiophenes, polyvinylthiophene), polypyrroles or the organometallic complexes (Cu) of phthalocyanine or porphyrin.

Polymeric ferroelectrics based on fluorinated polyenes, such as polyvinylidene difluoride, polytrifluoroethylenes, or the copolymers or terpolymers thereof, are particularly suitable on account of their chemical stability or their good processability. Further possible materials in this class are e.g. polyvinyl chloride, the copolymer vinyl acetate/vinylidene cynanide, polyacrylonitride, polyparaxylylene, nylon and/or the like. Inorganic materials such as SBT (strontium bismuth tantalate) or PZT (lead zirconium titanate) in a thin layer are equally suitable.

The dielectrics may be either of inorganic or of organic nature.

The integration of the inorganic dielectrics silicon dioxide or silicon nitride has been successfully demonstrated. Aluminum oxide, zinc oxide, zirconium oxide, hafnium oxide and/or the like are also suitable.

The organic dielectrics such as polystyrene, polyethylene, polyester, polyurethanes, polycarbonates, polyacrylates, polyimides, polyether, polybenzoxazoles and/or the like are particularly suitable owing to their potential printability.

For the fabrication of the electrodes and connecting lines between the cells and transistors, metals (Pd, Au, Pt, Ni, Cu, Ti, etc.) are suitable on account of their low nonreactive resistance. For less stringent demands, it is also possible to use organic doped semiconductors such as camphorsulfonic-acid-doped polyaniline or polystyrenesulfonic-acid-doped polythiophenes and/or the like.

Other features which are considered as characteristic for the invention are set forth in the appended claims.

Although the invention is illustrated and described herein as embodied in a semiconductor memory cell and semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
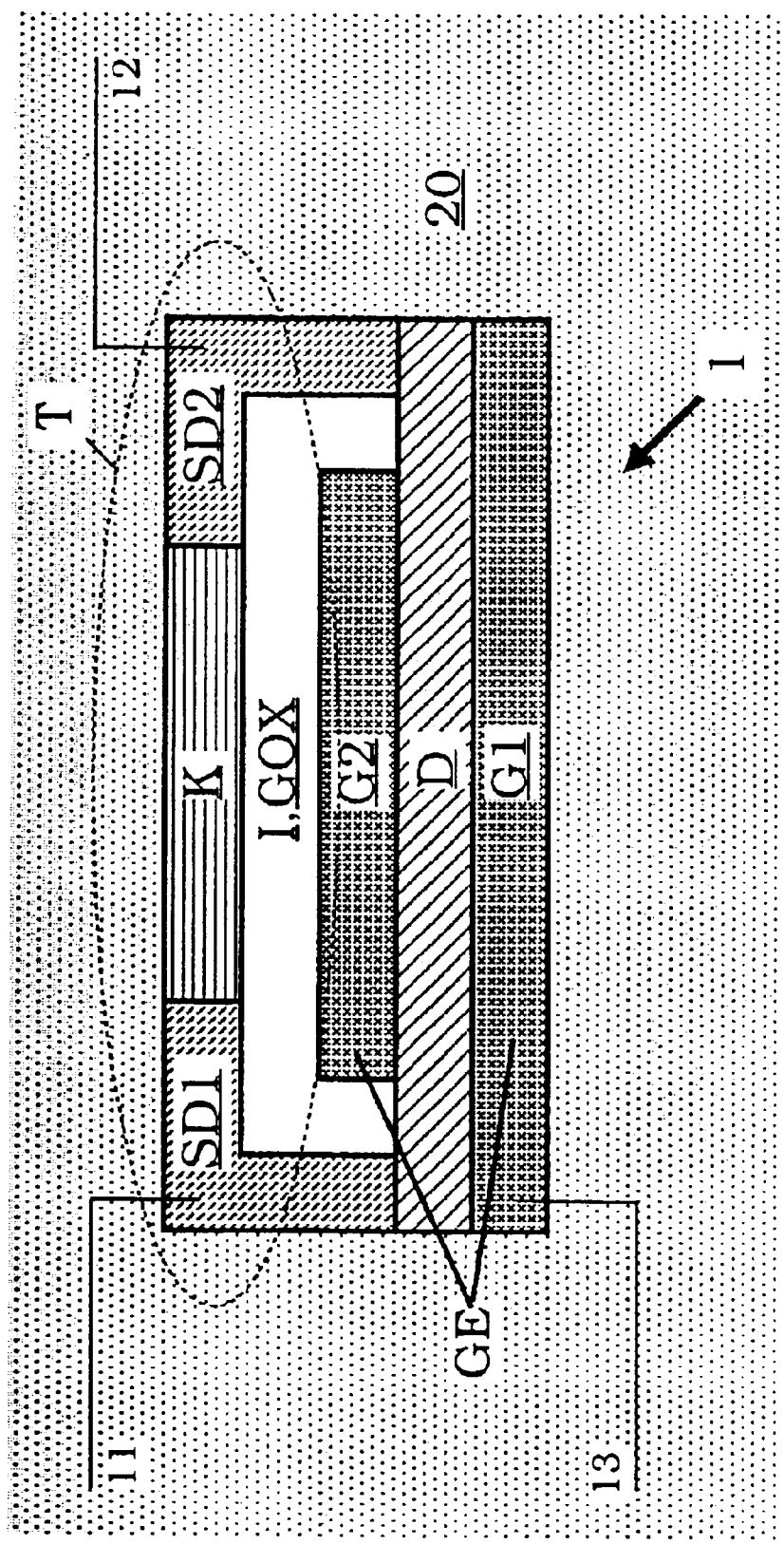
FIGS. 1–8 are sectional side views of various embodiments of the semiconductor memory cell according to the invention.

Referring now to the figures of the drawing in detail and first, particularly, to the illustrations of FIGS. 1 to 8, identical reference symbols designate identical or functionally identical elements or material regions, without a detailed description being given or repeated each time they occur.

Embodiments of the semiconductor memory cell 1 according to the invention are shown in each case in the form of a lateral cross-sectional view. The semiconductor memory cell or a multiplicity thereof is or are embedded in an electrically insulating material region 20, to be precise on a substrate that is not shown here.

In this case, virtually any desired materials such as plastics, glass, paper, semiconductor substrates, etc. can be used as the substrate. Conductive substrates, e.g. thin metal films, are also conceivable if an insulation layer is applied first of all. This substrate as such is not illustrated in the figures; rather, only the substantially electrically insulating material region 20 for embedding is shown.

Provision is made of a first source/drain region SD1, a second source/drain region SD2 and a channel region K provided in between, which contains an organic semiconductor material. The source/drain regions SD1 and SD2 are electrically contact-connected toward the outside, for example, via lines 11 and 12.

The contact connection of the source/drain regions depends, in principle, on the chosen arrangement of the semiconductor memory device, that is to say the arrangement of the semiconductor memories with respect to one another. In this case, an arrangement may be preferred in which contacts occur only at the edge of a matrix. However, as indicated in FIGS. 1 to 8, explicit contacts to each source/drain region and/or to each gate region are also conceivable.

Embodiments of the semiconductor memory cell according to the invention which do not have a selection gate are discussed below with reference to FIGS. 1 to 4.

In the embodiment of FIG. 1, the gate insulation region I, GOX together with the second gate electrode device G2 are accommodated in a vessel-like manner in a material region formed by the source/drain regions SD1, SD2 with the channel region K made of the organic semiconductor material provided in between. The ferrocapacitor of the embodiment of FIG. 1 is formed by the first and second gate electrode devices G1 and G2 with the dielectric region D made of a ferroelectric dielectric provided in between. The first gate electrode is contacted to the outside via a line device 13. The second gate electrode G2 may simultaneously form the crucial gate electrode of the organic field-effect transistor T constructed above that. The identifier GE marks a gate electrode configuration of the field-effect transistor device T. The channel of the organic field-effect transistor T is formed at the interface between the organic semiconductor material of the channel region K and the gate dielectric I, GOX.

In order to explain the functioning of the embodiment of FIG. 1, it is assumed here that the organic semiconductor in the channel region K is formed from the p-type channel material pentacene. The ferrocapacitor is polarized, then, such that the positive polarization charge forms at the second gate electrode G2, while the negative polarization charge is situated at the first gate electrode device G1. The second gate electrode G2, illustrated at the top in FIG. 1, is thereby polarized such that the positive induction charge forms on the side opposite the ferroelectric layer, which charge controls the transistor channel in the channel region K. After a corresponding potential gradient has been applied to the source/drain regions SD1, SD2, an electric current flows through the channel region since the transistor T is then in the ON state. This switching state can always be read out as long as the polarization of the ferrocapacitor is not changed.

Figure 2:
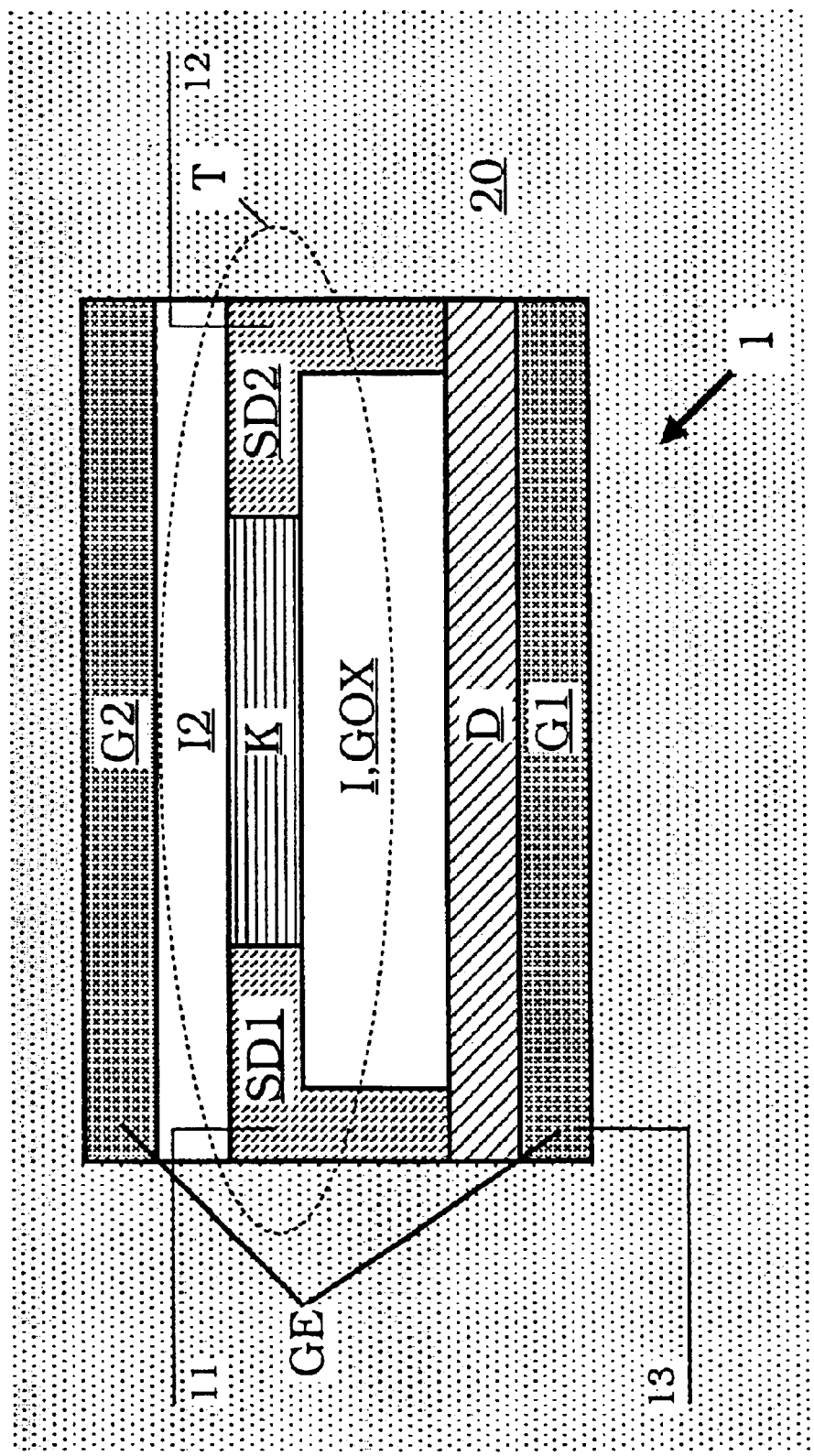

The embodiment of FIG. 2 is derived directly from the embodiment of FIG. 1, the second gate electrode device G2 being removed from the recess of the material region formed by the source/drain regions SD1, SD2 and the channel region K and having been arranged on the top side of the transistor T with the interposition of a further second insulation layer 12. In a special embodiment, said additional second gate electrode G2 could correspond to a type of bulk terminal, as is known in silicon technology. In this case, it serves as a counter-electrode for the polarization of the dielectric region D of the capacitor.

Figure 3:
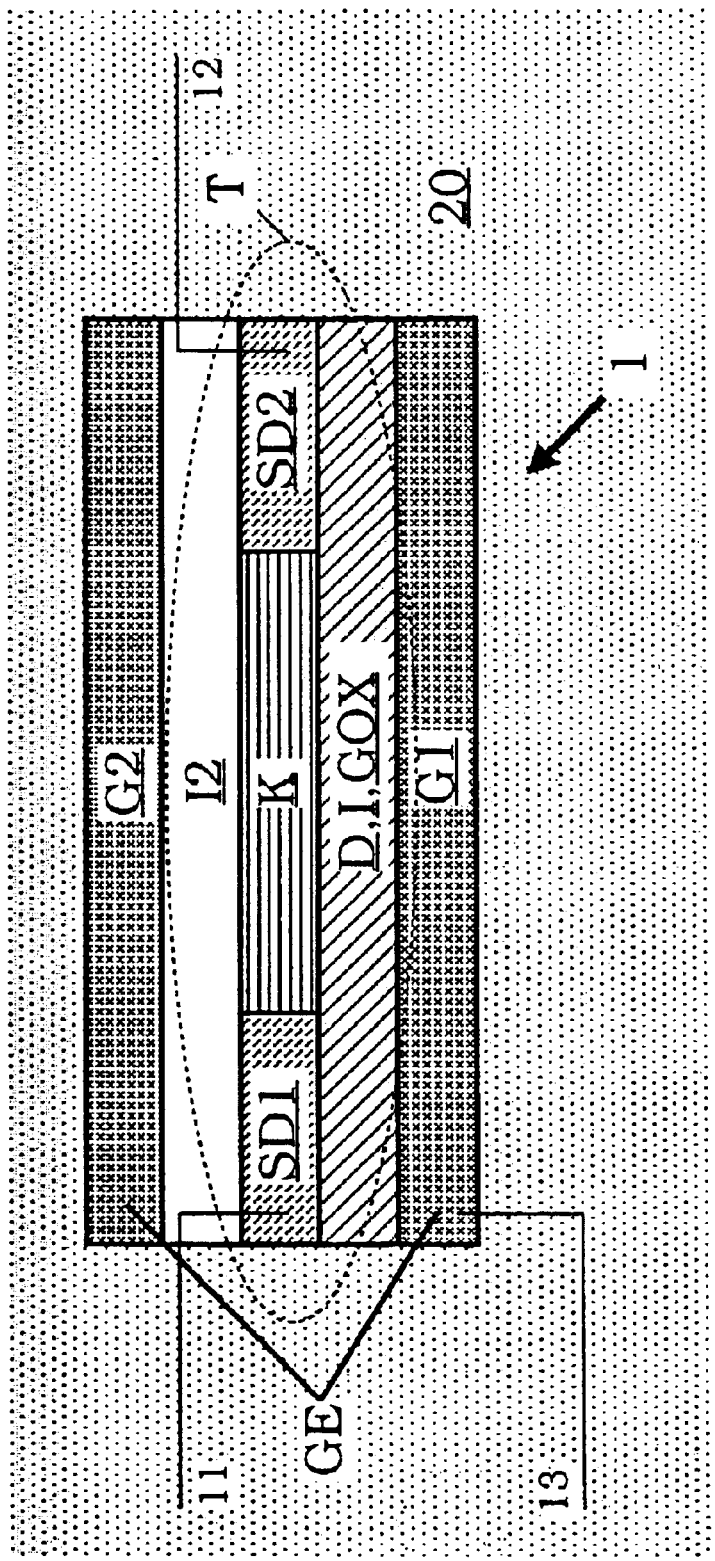

Proceeding from the embodiment of FIG. 2, a further simplification of the memory cell according to the invention can be achieved by relinquishing the vessel-like structure of the material region formed by the source/drain regions SD1, SD2 and the channel region K, with inclusion of the gate dielectric I, GOX, in order that the source/drain regions SD1, SD2 and the channel region K lying in between are formed in a planar manner with omission of the first insulation region or gate insulation region I, GOX, as is illustrated in FIG. 3. In this case, the material of the dielectric region D simultaneously forms the insulation between the transistor T and the first gate electrode device G1.

In order to prevent a change to the transistor characteristic through a change in the induction charge on the top metal electrode, that is to say the second gate electrode G2 of the ferroelectric capacitor, it is admittedly possible, given a suitable choice of material and deposition conditions, for the gate dielectric to be applied directly to the ferroelectric layer, as is illustrated in the embodiment of FIG. 2, thereby obviating the top metal electrode or second gate electrode device G2 as directly coupled electrode of the capacitor.

However, a different, if appropriate much simpler, possibility consists in completely dispensing with the gate dielectric, as in the embodiment of FIG. 3, and switching off the channel material of the channel material K of the transistor T directly on the ferroelectric layer of the modulation region M, because the ferroelectric layer has sufficient insulation properties.

Figure 4:
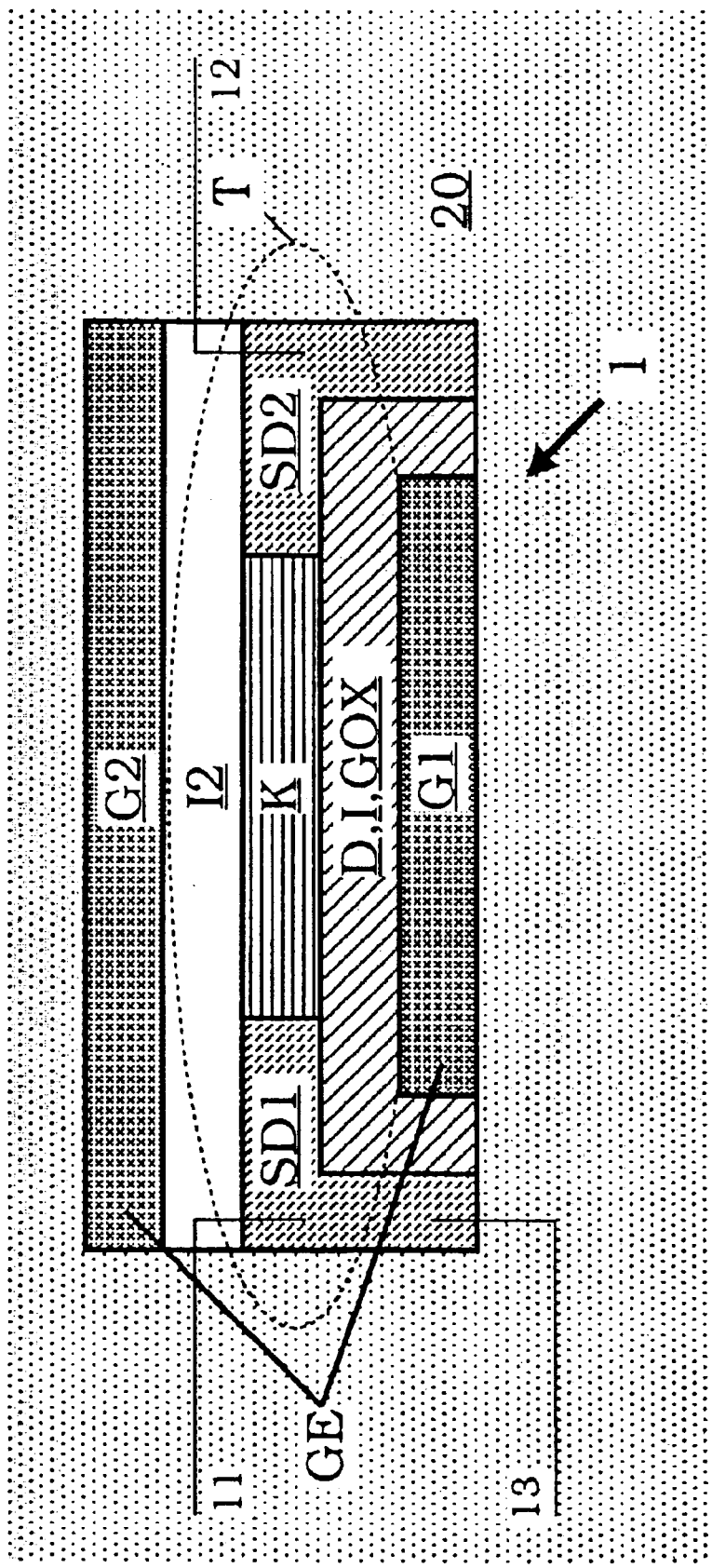

In the transition to the embodiment shown in FIG. 4, proceeding from the embodiment of FIG. 3, the dielectric region D with the ferroelectric is once again embedded in a type of vessel structure or cladding structure which is formed by the source/drain regions SD1, SD2 and the channel material forming the channel region K.

The information stored in the transistor can be read out by way of a continuity test between the source/drain regions SD1, SD2. The states "conducting" and "nonconducting" which can be set in a static manner by way of the ferroelectric layer in the modulation region M in the entire channel region K map the stored information items "1" and "0", respectively, in this case. The result of the continuity test thus yields the stored information of the semiconductor memory cell according to the invention.

Figure 5:
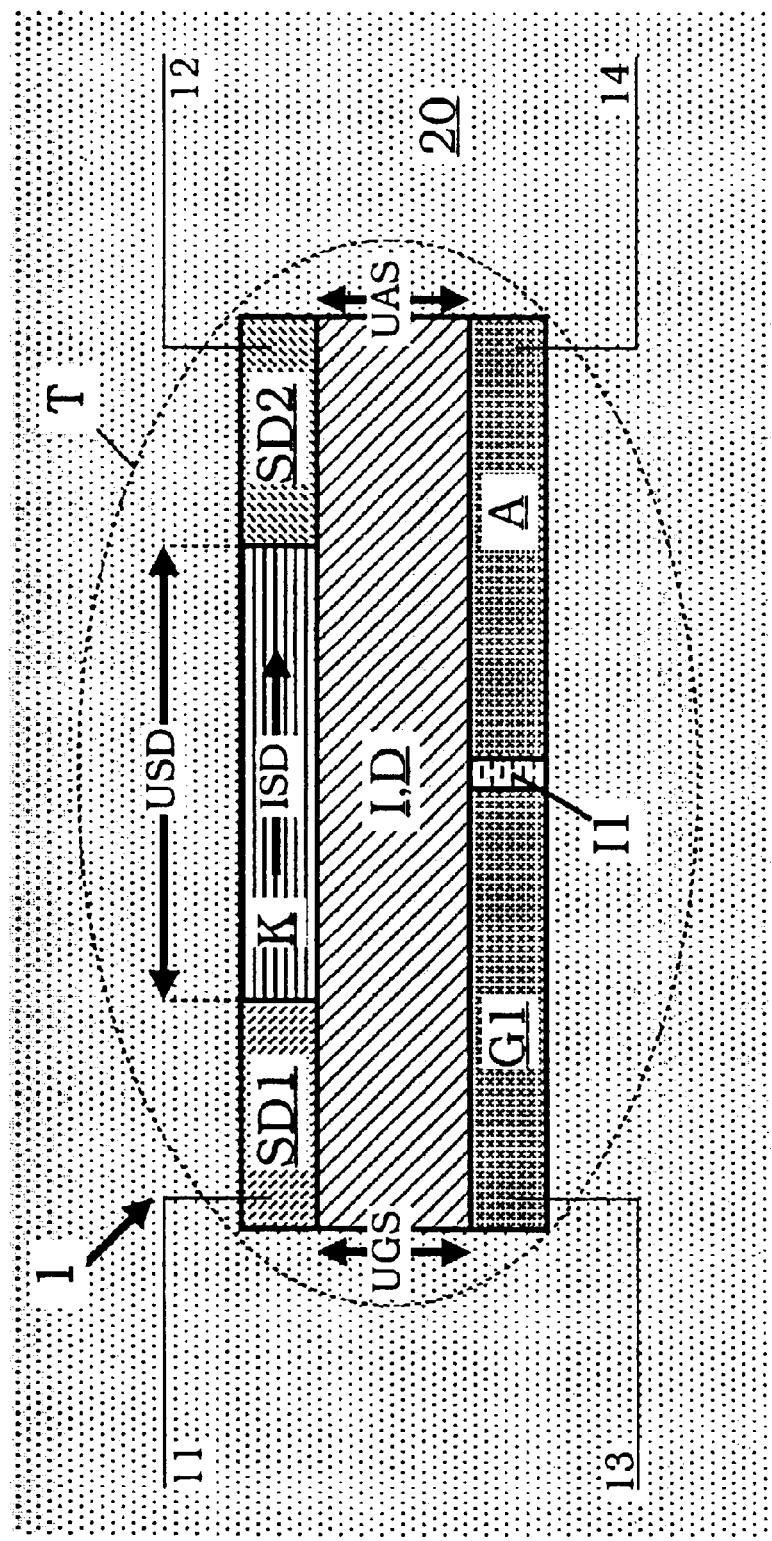

In FIG. 5, an insulation region I is formed below the source/drain regions SD1 and SD2 and the channel region K, said insulation region in this case being identical to the storage dielectric D in the form of a ferroelectric material. The vertical alignment and orientation of the individual material regions can also be used in opposite fashion, thereby producing an arrangement that is essentially upside down with respect to that in FIGS. 1 to 8.

The storage dielectric D extends laterally over the full extent of the source/drain regions SD1, as large as SD2, and the channel region K. Below the storage dielectric D there are provided a first gate electrode G1 and, spatially and materially separated therefrom by a further insulation region I1, a selection gate electrode A, which are electrically contact-connected toward the outside e.g. via line devices 13 and 14, respectively, that are indicated. This means that the other capacitor electrode G1 is formed on the other side of the storage dielectric opposite the second gate electrode G2. The insulation region, also called gate oxide, covers, if appropriate, an underlying second gate electrode G2 as capacitor electrode and also the selection electrode A. The distance between the electrodes must be chosen to be comparatively small.

During the operation of the semiconductor memory cell 1 according to the invention in FIG. 5, by means of the setting of a gate/source voltage UGS between the first gate electrode G1 and the source/drain regions SD1 and SD2, the state of polarization of the ferroelectric storage dielectric D lying in between is defined and, consequently, the corresponding information is stored in nonvolatile form. On account of its proximity, the storage dielectric D or the state of polarization influences the conductivity of the channel region K, so that the corresponding state of polarization of the storage dielectric D and the information state stored therein can be tapped off via the corresponding source/drain current ISD via the channel region K between the source/drain regions SD1 and SD2.

If the memory cell illustrated in FIG. 5 is not intended to be accessed, then it is possible, by applying to the selection gate electrode A a potential difference UAS toward the source/drain regions SD1 and SD2, to interrupt the channel region K in such a way that the source/drain current ISD is virtually suppressed. As a result, the field-effect transistor device T is essentially switched off, to be precise without the state of polarization of the storage dielectric D being crucially influenced by the potential difference UAS.

In the embodiment of FIG. 5, the first gate electrode G1 and the selection gate electrode A are situated in a common layer region and are only laterally spaced apart from one another, and they have a very small lateral distance between one another.

In this case, the storage dielectric D is simultaneously used as gate dielectric. This has the advantage of a simplified process implementation during fabrication and a gate capacitance for the selection gate which is made higher when an inorganic ferroelectric is used.

Figure 6:
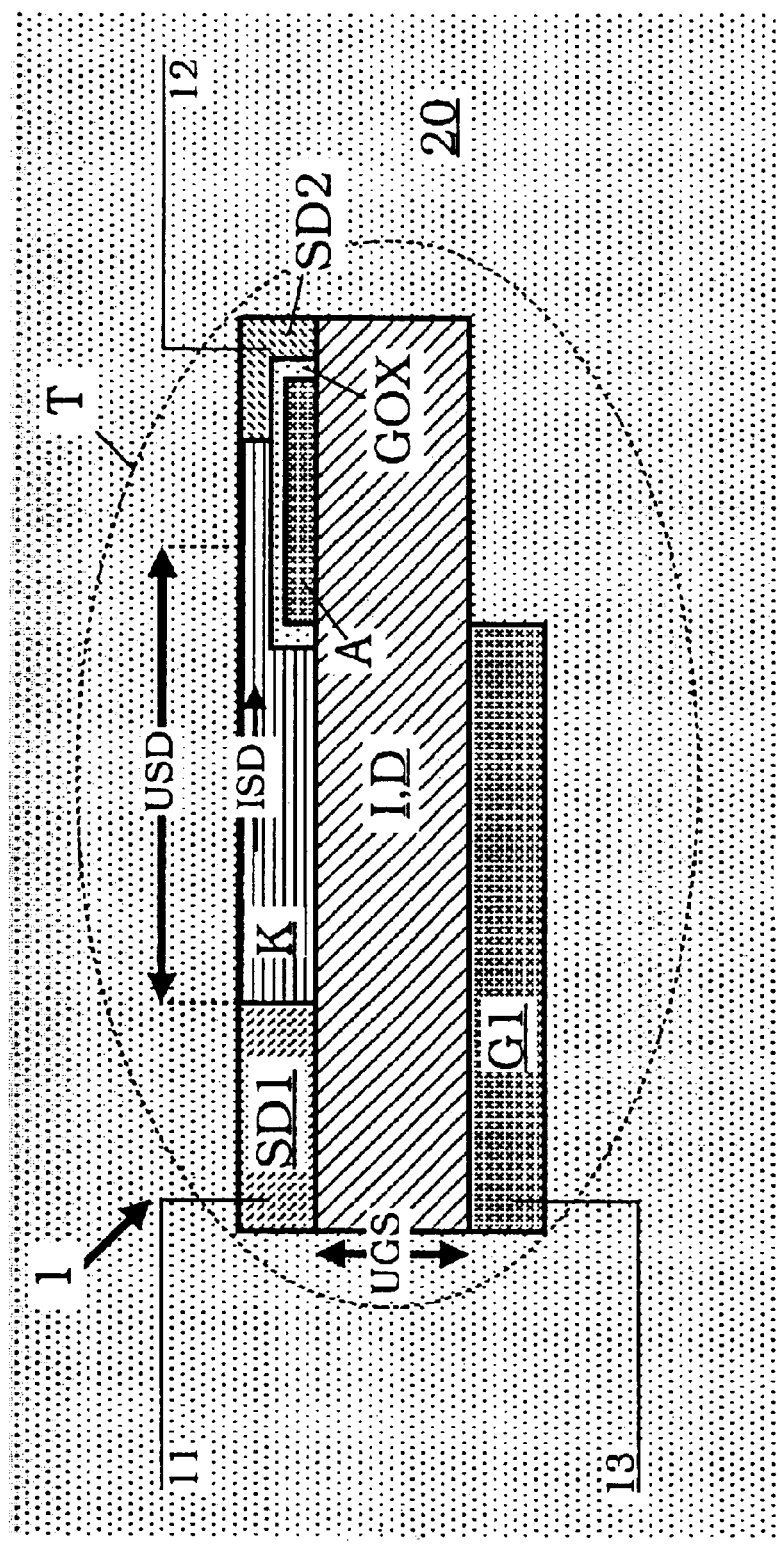

In the embodiment of FIG. 6, the first gate electrode G1 and the selection gate electrode A1 are additionally spaced apart from one another vertically, so that the insulation region I, here again in the form of the storage dielectric D provided altogether, is arranged between these two gate electrodes G1 and A. In the embodiment of FIG. 6, the selection gate electrode A is embedded in the channel region K and in the second source/drain region SD2. In this case, a gate oxide GOX is also provided in order to provide the necessary electrical insulation with respect to the channel region K and with respect to the second source/drain region SD2.

Figure 7:
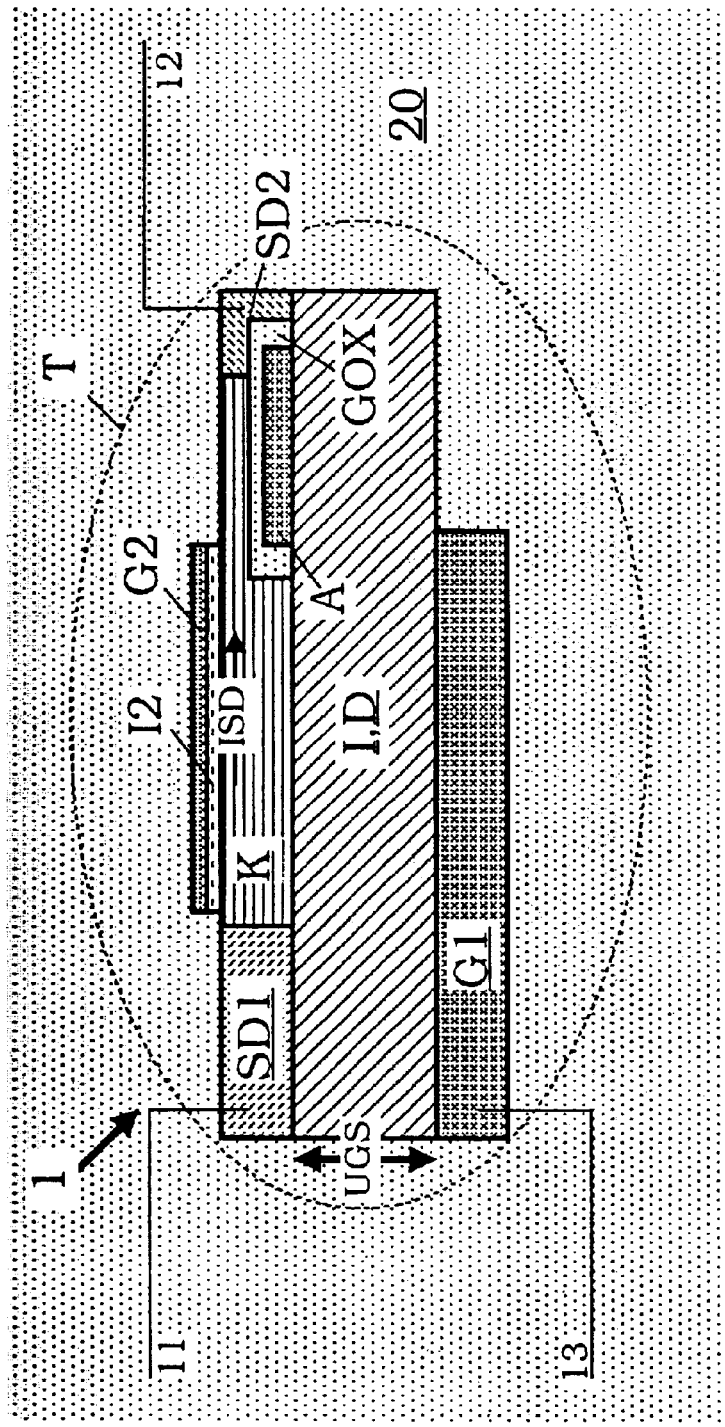

In the embodiment of FIG. 7, a second gate electrode G2 is additionally provided with respect to the embodiment of FIG. 6. Said electrode is arranged on a side of the source/drain regions SD1, SD2 and of the channel region K which is remote from the first gate electrode G1, and is insulated from them by means of a further insulation layer 12. Said second gate electrode G2 serves for influencing the storage dielectric D and thus functions as a second capacitor electrode, so that the actual field-effect transistor device T is arranged between the two capacitor plates or capacitor electrodes, namely the electrodes G1 and G2.

Figure 8:
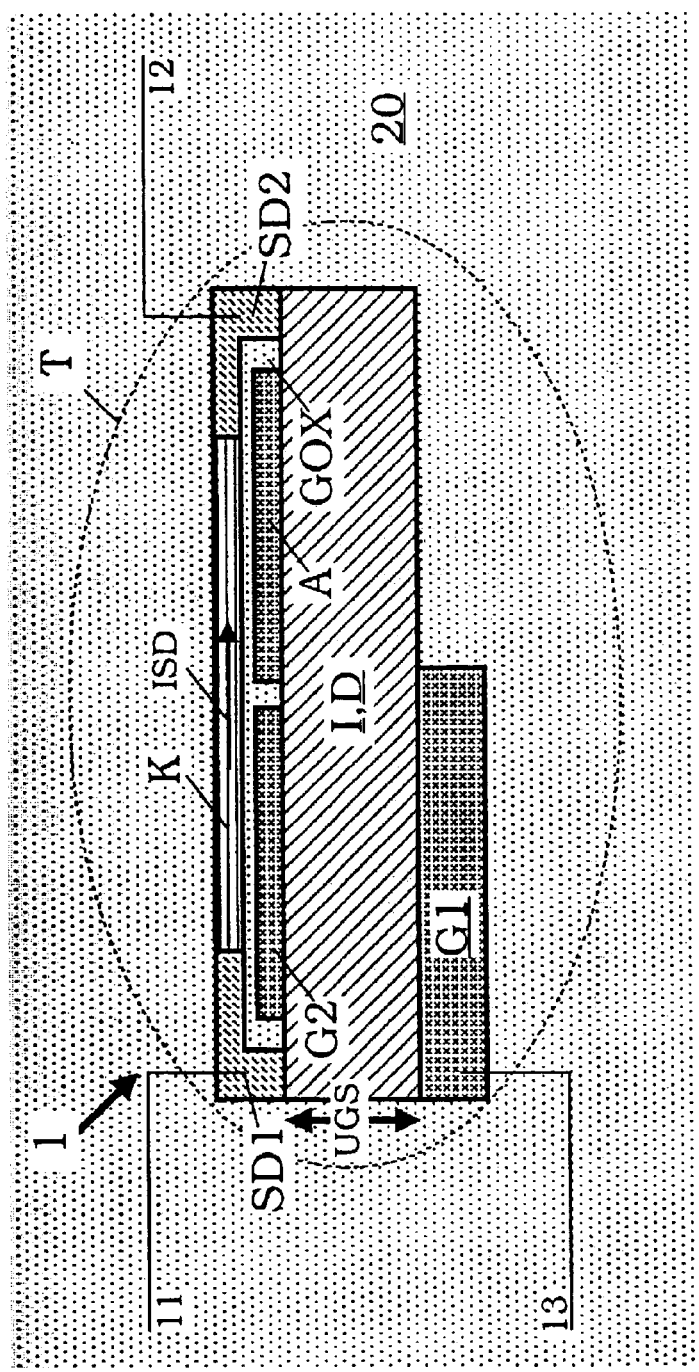
Figure 9:
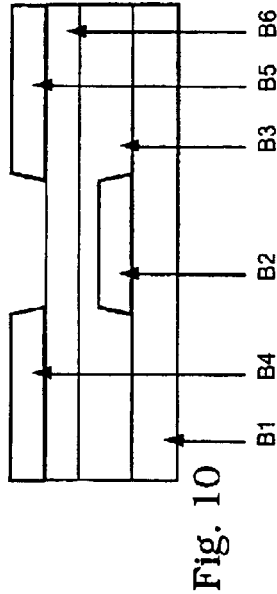
FIGS. 9–14 are diagrammatic side views showing six different variants for structures of field-effect transistor devices using organic semiconductor materials.
Figure 10:
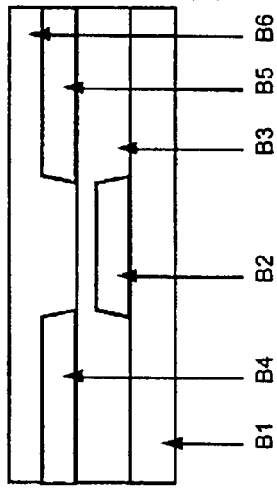
Figure 11:
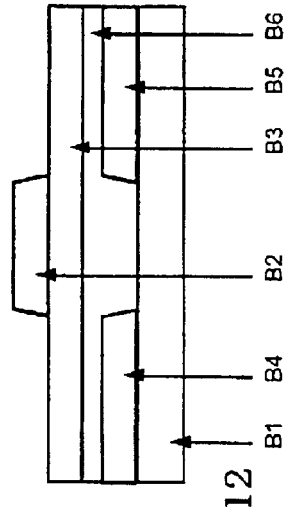
Figure 12:
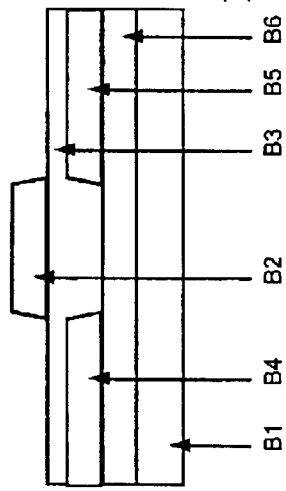
Figure 13:
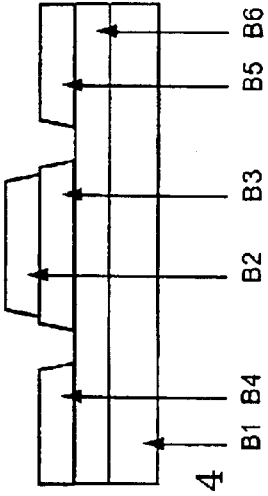
Figure 14:
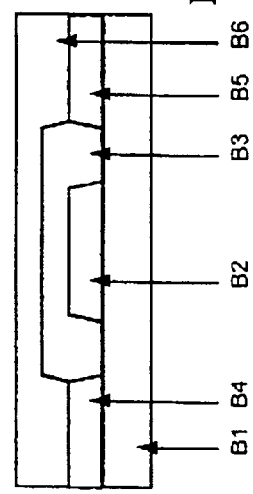

In the embodiment of FIG. 8, with respect to the embodiment of FIG. 6, the recess region in which the selection electrode A is arranged is provided in laterally extended fashion, so that the second gate electrode G2, functioning as second capacitor electrode, can be arranged there in the likewise extended gate oxide region GOX, to be precise on the same side with regard to the channel region K and with regard to the source/drain regions SD1, SD2 as the first gate electrode G1 and the selection gate electrode A.

In the embodiment of FIG. 8, the storage dielectric D is at the same time in part also concomitantly used as gate dielectric. The one capacitor electrode G2 and the selection electrode A are in this case situated in one plane as in FIG. 5. However, in this case the gate dielectric GOX isolates both electrodes G2 and A from the channel region K. This has the advantage of a particularly simple process implementation during fabrication, and a gate capacitance for the selection gate A which is made higher when an inorganic ferroelectric is used. Optionally, analogously to the embodiment of FIG. 7, a second gate electrode G2 with respect to G1 may also be provided on the side opposite to the channel.

FIGS. 9 to 14 show, in sectional side view, field-effect transistor devices on the basis of the present invention using organic semiconductor materials, the same reference symbols always designating the same or functionally identical elements in all the figures.

The substrate is identified B1. The gate electrode B2, the gate dielectric layer B3, the source contacts B4, the drain contacts B5 and the organic semiconductor layer B6 are in each case deposited successively in a corresponding order onto a suitable substrate B1 and are patterned in accordance with the required topological properties.

We claim:

1. A semiconductor memory cell, comprising:
   a field-effect transistor device forming an access device, said field-effect transistor device having first and second source/drain regions, a channel region comprising an organic semiconductor material, between said first and second source/drain regions, and a gate electrode configuration; and
   a storage capacitor having a ferroelectric storage dielectric and at least one electrode forming a first gate electrode of said gate electrode configuration of said field-effect transistor device.

2. The semiconductor memory cell according to claim 1, wherein said gate electrode configuration includes a selection gate electrode for selectively switching said field-effect transistor device on and off in a defined and controlled manner, substantially without influencing a storage dielectric of said storage capacitor and substantially independently of said first gate electrode.

3. The semiconductor memory cell according to claim 1, wherein different electric currents flowing for a given electrical potential difference between said first and second source/drain regions via said channel region represent mutually different information states of the semiconductor memory cell.

4. The semiconductor memory cell according to claim 3, wherein the electric current via the channel region is dependent on a state of polarization of said ferroelectric storage dielectric corresponding to a given information state.

5. The semiconductor memory cell according to claim 1, which further comprises at least one insulation region electrically insulating said gate electrode configuration from said source/drain regions and said channel region.

6. The semiconductor memory cell according to claim 1, wherein at least a part of said ferroelectric storage dielectric is formed between said channel region and said first gate electrode.

7. The semiconductor memory cell according to claim 5, wherein at least a cart of said ferroelectric storage dielectric forms at least a part of said insulation region between said channel region and said first gate electrode.

8. The semiconductor memory cell according to claim 1, wherein said ferroelectric storage dielectric is formed in direct proximity of at least one of said channel region, at least one of said first and second source/drain regions, said first gate electrode, and said selection gate electrode.

9. The semiconductor memory cell according to claim 1, wherein said ferroelectric storage dielectric is formed in contact with at least one of said channel region, said first and second source/drain regions, said first gate electrode, and said selection gate electrode.

10. The semiconductor memory cell according to claim 1, wherein, relative to a first direction defined by an arrangement of said source/drain regions and of said channel region, said first gate electrode and said selection gate electrode are arranged laterally offset with respect to one another without overlapping one another.

11. The semiconductor memory cell according to claim 10, wherein said first gate electrode and said selection gate electrode are arranged at a very small lateral spacing distance from one another laterally.

12. The semiconductor memory cell according to claim 10, wherein, with reference to the first direction, said first gate electrode and said selection gate electrode are arranged vertically offset with respect to one another.

13. The semiconductor memory cell according to claim 12, wherein said selection gate electrode is formed on a side of one of an insulation region facing said channel region and said source/drain regions, and said selection gate electrode is electrically insulated therefrom.

14. The semiconductor memory cell according to claim 1, wherein a second gate electrode of said gate electrode configuration functions as a second capacitor electrode and an electrode influencing said ferroelectric storage dielectric.

15. The semiconductor memory cell according to claim 14, wherein said second gate electrode is a free electrode.

16. The semiconductor memory cell according to claim 14, wherein said second gate electrode is a floating gate.

17. The semiconductor memory cell according to claim 14, wherein at least a part of said ferroelectric storage dielectric is formed between said first and second gate electrodes.

18. The semiconductor memory cell according to claim 14, wherein said second gate electrode is formed on a side of one of said channel region and said source/drain regions remote from said first gate electrode.

19. The semiconductor memory cell according to claim 1, wherein at least one of the following is true:
   said ferroelectric storage dielectric contains inorganic material;
   said ferroelectric storage dielectric consists of inorganic material;
   said ferroelectric storage dielectric contains organic material; and
   said ferroelectric storage dielectric consists of organic material.

20. The semiconductor memory cell according to claim 19, wherein said inorganic material is a material selected from the group consisting of strontium bismuth tantalate and Lead zirconium titanate.

21. The semiconductor memory cell according to claim 19, wherein said organic material is a material selected from the group consisting of a polymeric ferroelectric based on fluorinated polyenes, polyvinylidene difluoride PVDF, polytrifluoroethylene PtrFE, copolymers thereof, and terpolymers thereof.

22. The semiconductor memory cell according to claim 1, wherein said organic semiconductor material for said channel region comprises a p-type semiconductor based on a material selected from the group consisting of condensed aromatic compounds, polythiophenes, polypyrroles, and organometallic complexes of stalocyanin or porphyrin.

23. The semiconductor memory cell according to claim 22, wherein said condensed aromatic compounds are selected from the group consisting of anthracene, tetracene, and pentacene; wherein said polythiophenes are selected from the group consisting of poly-3-alkylthiophenes and polyvinylthiophenes; and wherein said organometallic complexes of stalocyanin or porphyrin are formed with copper.

24. The semiconductor memory cell according to claim 1, which comprises insulation regions formed with a material selected from the group consisting of an inorganic substance, an inorganic compound, an organic substance, and an organic compound.

25. The semiconductor memory cell according to claim 24, wherein said insulation regions are formed of a material selected from the group consisting of polymers, polystyrene, polyethylene, polyester, polyurethane, polycarbonate, polyacrylate, polyimide, polyether, polybenzoxazoles, mixtures thereof, and compounds thereof.

26. The semiconductor memory cell according to claim 24, wherein said insulation regions are formed of a material selected from the group consisting of silicon dioxide, silicon nitride, aluminum oxide, zinc oxide, hafnium oxide, mixtures thereof, and compounds thereof.

27. The semiconductor memory cell according to claim 1, which comprises a substrate carrying said field-effect transistor device and said storage capacitor, said substrate being formed of a material selected from the group consisting of metal, plastic, and paper.

28. The semiconductor memory cell according to claim 27, wherein said substrate is a flexible substrate.

29. The semiconductor memory cell according to claim 27, wherein said metal is selected from the group consisting of copper, nickel, gold, and iron sheet; and said plastic is selected from the group consisting of polystyrene, polyethylene, polyester, polyurethane, polycarbonate, polyacrylate, polyimide, polyether, and polybenzoxazole.

30. A semiconductor memory device, comprising a plurality of memory cells according to claim 1.

31. The semiconductor memory device according to claim 30, wherein said memory cells are interconnected via a direct connection of at least one of the respective said source/drain regions and of the respective said gate regions of a given semiconductor memory cell to a corresponding source/drain region and a corresponding gate regions of an adjacent memory cell of the semiconductor memory device.

32. The semiconductor memory device according to claim 30, which comprises additional metallization forming a connection of one of said source/drain regions and gate regions of a given semiconductor memory cell to respectively other memory cells of the semiconductor memory device.

33. The semiconductor memory device according to claim 32, wherein said additional metallization is formed with a metal track including Corresponding contacts.

34. The semiconductor memory device according to claim 1, wherein said channel region consists of the organic semiconductor material.

35. The semiconductor memory device according to claim 34, wherein said organic semiconductor material for said channel region consists of a p-type semiconductor based on a material selected from the group consisting of condensed aromatic compounds, polythiophenes, polypyrroles, and organometallic complexes of stalocyanin or porphyrin.

36. The semiconductor memory device according to claim 1, which comprises insulation regions consisting of a material selected from the group consisting of an inorganic substance, an inorganic compound, an organic substance, and an organic compound.

* * * * *